United States Patent
Xu et al.

(10) Patent No.: US 7,855,563 B2
(45) Date of Patent: Dec. 21, 2010

(54) ROBUST CABLE CONNECTIVITY TEST RECEIVER FOR HIGH-SPEED DATA RECEIVER

(75) Inventors: Huihao Xu, Brooklyn, NY (US); Louis L. Hsu, Fishkill, NY (US); Kevin G. Kramer, Wappingers Falls, NY (US); James D. Rockrohr, Hopewell Junction, NY (US); Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 729 days.

(21) Appl. No.: 11/766,268

(22) Filed: Jun. 21, 2007

(65) Prior Publication Data

US 2008/0316930 A1 Dec. 25, 2008

(51) Int. Cl.
*G01R 31/00* (2006.01)
*H04B 3/46* (2006.01)

(52) U.S. Cl. ..................... 324/543; 324/500; 375/224
(58) Field of Classification Search ................. 324/500, 324/543; 375/224
See application file for complete search history.

(56) References Cited

U.S. PATENT DOCUMENTS

| | | | |
|---|---|---|---|
| 5,142,526 A | 8/1992 | Moriue et al. | |
| 5,982,743 A * | 11/1999 | Kusano | 370/217 |
| 6,129,569 A | 10/2000 | Fernandez | |
| 6,181,454 B1 | 1/2001 | Nagahori et al. | |
| 6,505,317 B1 | 1/2003 | Smith et al. | |
| 6,597,224 B2 | 7/2003 | Lin et al. | |
| 7,095,263 B2 * | 8/2006 | Liu | 327/205 |
| 2005/0094737 A1 | 5/2005 | Vorenkamp | |
| 2005/0190828 A1 * | 9/2005 | Hsu et al. | 375/224 |

OTHER PUBLICATIONS

IEEE, "1149.6 Standard for Boundary-Scan Testing of Advanced Digital Networks," Institute of Electrical and Electronics Engineers, Apr. 17, 2003.
Phillip E. Allen et al., CMOS Analog Circuit Design Second Edition, 2002, pp. 466-475.
Office Action U.S. Appl. No. 11/985,956, filed Nov. 19, 2007.

* cited by examiner

*Primary Examiner*—Timothy J Dole
*Assistant Examiner*—Farhana Hoque
(74) *Attorney, Agent, or Firm*—Ian D. MacKinnon (57) ABSTRACT

A system is provided for detecting a fault in a signal transmission path. In one embodiment, the system can include a variable amplitude signal attenuator which is operable to modify an input signal by variably attenuating a signal voltage swing of the input signal. Desirably, the input signal is attenuated only when transitioning from a high signal voltage level towards a low signal voltage level d variably, such that a larger high-to-low signal voltage swing is attenuated more than a smaller high-to-low signal voltage swing. Desirably, a comparator, which may apply hysteresis to the output signals, may detect a crossing of a reference voltage level by the modified input signal. In this way, when the comparator does not detect an expected crossing of the reference voltage level by the modified input signal, a determination can be made that a fault exists in the signal transmission path.

20 Claims, 6 Drawing Sheets

ROBUST CABLE CONNECTIVITY TEST RECEIVER FOR HIGH-SPEED DATA RECEIVER

BACKGROUND OF THE INVENTION

The present invention relates to the determination of connectivity faults in communication systems, especially between chips at opposite ends of serial data transmission path.

Connectivity faults are of several types including "stuck-at" faults in which a transmitted signal appears stuck at either a low state or a high state and fails to transition between states. Other types of connectivity faults include those in which a coupling capacitor used for alternating current (AC) mode operation is shorted, and those in which the arriving signal appears to "float", such as when the cable is disconnected from the signal source. Elements which provide connectivity between chips at remote and near ends of a transmission link include at least a transmitter of the chip at the remote end, the package of the chip at the remote end, a card connecting the remote end chip to the chip at the near end, an AC coupling capacitor, the package of the near-end chip, and a receiver implemented on the near-end chip. Connectivity between chips of such system is frequently referred to as "cable connectivity", whether or not a literal cable (rather than a card or other conductive connection) is provided between the packages of respective chips. One way to test the cable connectivity is to send a stream of test data from a remote transmitter and then verify the data received at the near-end receiver.

In AC coupled transmission links, termination is provided at the source (transmitter side) such that no DC current is sunk at the receiver end. In such AC coupling mode, a high-pass filter exists by the combination of the series AC coupling capacitor (also referred to as a "DC blocking capacitor") and a termination resistor which is shunted to ground. The high-pass filter causes low-frequency test signals to decay with an "RC" time constant determined by the magnitude of the resistance (R) and the capacitance (C) of the respective circuit elements, which can be fixed or variable.

Differential signal transmission is frequently favored for the transmission of higher frequency RF signals over signal conductors. An advantage of differential signal transmission is larger peak-to-peak differential signal swing and improved common mode noise rejection. However, differential signal transmission poses particular challenges. Heretofore, robust systems have not been provided for detecting and isolating a single-ended connectivity failure of a differential signal transmission link. For differential signal transmission links, it is not sufficient to detect the presence and/or absence of signals on a pair of signal conductors, a robust cable fault detector must determine which of two cables carrying the paired differential signals is faulty. The challenges of testing are particularly great when detecting a failing signal conductor when communication between chips is provided in an AC coupling mode in which signals must pass through an AC coupling capacitor, because such capacitor blocks direct current (DC) transmission. While some techniques such as AGC (adjusted gain control), DFE (decision feed-back equalization), etc., are available to reconstruct received signals, such techniques are of no use when signals are suddenly ruined by signal interference, or accidental disconnection of a cable from one or two ends of the transmission link.

Conventional signal detectors operate by detecting the absence of a valid signal within a specified latency. However, a signal detector cannot determine whether the failure is due to the cable, or the data itself. Neither can it tell which cable has a problem, or what type of defect mechanism is present, i.e., whether the fault is one of stuck-at high, stuck-at low or floating. This is because such signal detectors detect the presence of absence of signal from the difference between levels of a pair of differential signals arriving from the transmission link.

Figure 1:
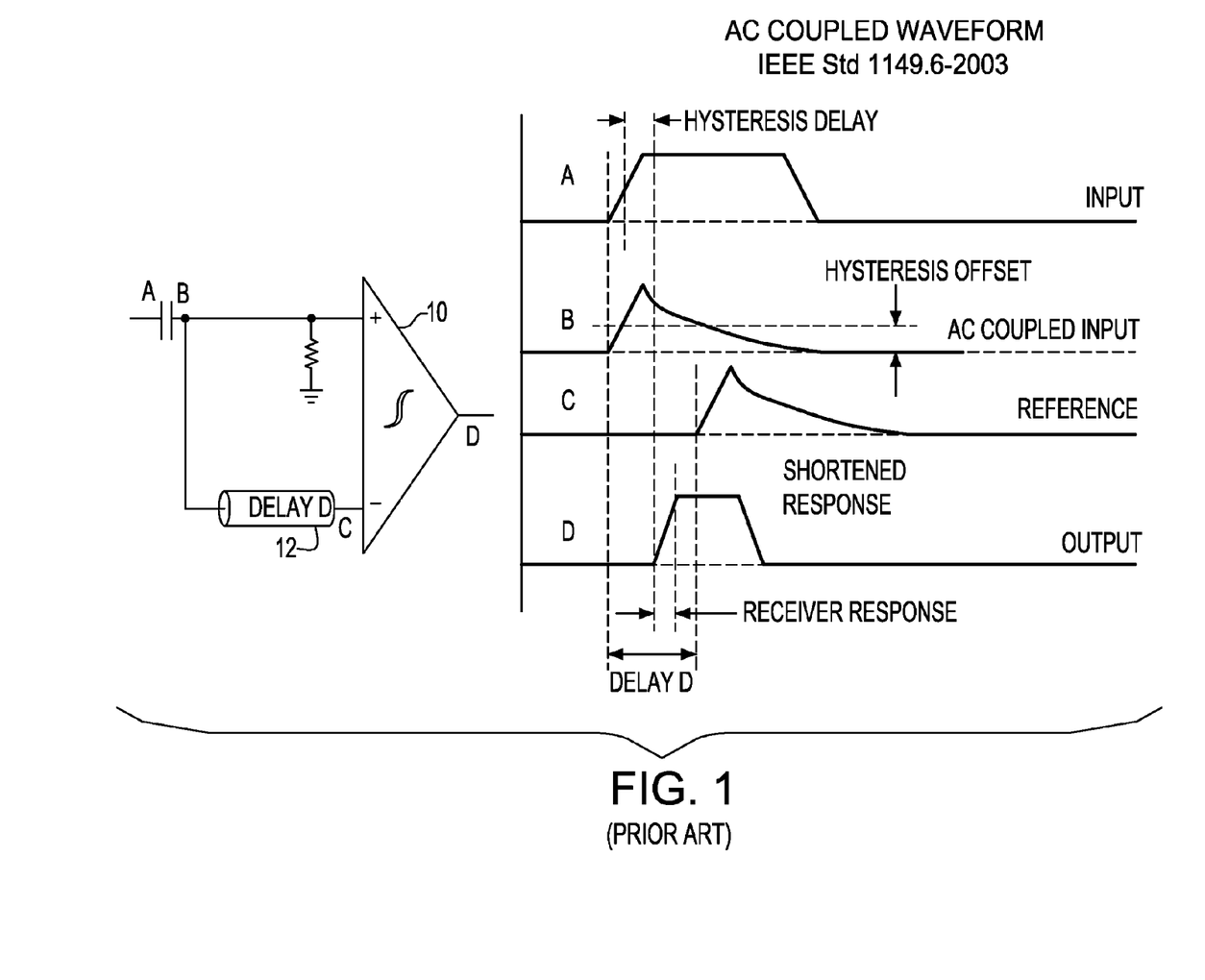
FIG. 1 is a block and schematic diagram illustrating operational specifications of prior art IEEE 1149.6 standard.

The 1149.6 standard of the Institute of Electrical and Electronics Engineers (IEEE) entitled "IEEE Standard for Boundary-Scan Testing of Advanced Digital Networks", published April, 2003 (hereinafter IEEE 1149.6), specifies a cable fault detector at a receiver end of a transmission link for detecting single-ended cable faults for both AC and DC coupling modes. The published IEEE 1149.6 standard provides an example of using a hysteresis comparator 10 (FIG. 1) to detect loss of signal on the transmission link. In the published example, the hysteresis comparator compares the level of a signal arriving from a single-ended cable of the transmission link with a delayed version of the same signal. The published example does not provide for robust testing, because when testing for a signal in AC-coupled mode, the comparator's operation destroys the hysteresis effect. For an AC coupled signal having an RC decay, as described above, when the decay drops to a certain level, the output of the hysteresis comparator 10 changes state. The hysteresis comparator 10 of the published example is poorly suited for testing an AC-coupled mode, because it does not maintain state when the AC-coupled signal decays.

Commonly assigned U.S. patent Publication No. 2005/0190828 to Hsu et al. describes a cable connectivity test receiver operable in accordance with IEEE 1149.6. However, that application does not seek to address the problems that are uncovered and addressed in accordance with the below-described embodiments of the invention. Said U.S. patent Publication 2005/0190828 is incorporated herein by reference.

SUMMARY OF THE INVENTION

In accordance with an embodiment of the invention, a system is provided for detecting a fault in a signal transmission path. In one embodiment, the system can include a variable amplitude signal attenuator which is operable to modify an input signal by variably attenuating a signal voltage swing of the input signal. Desirably, the input signal is attenuated only when transitioning from a high signal voltage level towards a low signal voltage level and variably, such that a larger high-to-low signal voltage swing is attenuated more than a smaller high-to-low signal voltage swing. Desirably, a comparator, which may apply hysteresis to the output signals, may detect a crossing of a reference voltage level by the modified input signal. In this way, when the comparator does not detect an expected crossing of the reference voltage level by the modified input signal, a determination can be made that the fault is detected in the signal transmission path.

DETAILED DESCRIPTION

IEEE 1149.6 compatible connectivity test receivers present a problem which has not been addressed heretofore. Signal amplitudes can vary greatly between signaling protocols such as Common Electrical Interconnect ("CEI"), Fiber Channel ("FC"), Infiniband™ ("IB"), and Serial Attached SCSI ("SAS"). The signal amplitudes can range from a few hundred millivolts peak-to-peak differential to 2000 mV peak-to-peak differential.

Large test signal amplitudes can cause exceed the limits of a cable connectivity test receiver that is designed for smaller amplitude signals. One problem is seen particularly when the test receiver is connected in a signal transmission path in AC-coupled mode. Due to the presence of the on-chip or off-chip AC-coupling capacitor, the test signal amplitude arriving from the transmitter is superimposed on top of a common mode voltage which is designed according to requirements of the data receiver. For good performance, the common mode voltage at the data receiver is usually set to a level close to the power supply voltage. In such case, an incoming cable test signal which has a large amplitude can exceed the level of the power supply voltage.

When the test signal exceeds the power supply voltage level on existing test receivers, it may not be possible for the test receiver for the test receiver to latch the test signal properly. Apart from a problem of insufficient power supply headroom, such condition can cause excessive stress to be placed on gate oxides of transistors included in a comparator stage of the receiver. In addition, under such condition, when handling a large amplitude test signal, some devices of the comparator may be operated in non-optimal regions.

Accordingly, a robust system, a cable connectivity test receiver is provided herein for detecting a fault in a signal transmission path used usable for the transmission of data, especially data which is transmitted serially by a differential pair of data signals at transmission rates exceeding one gigabit per second (Gbs). The system is capable to operating over a wide range of test signal amplitudes, e.g., from between about 600 mV peak-to-peak differential to about 2000 mV peak-to-peak differential, and perhaps a greater range. Such signal amplitude range is sufficient to accommodate cable connectivity test requirements of the IEEE 1149.6 standard, and various data communication standards, such as CEI, FC, IB and SAS mentioned above. According to various embodiments of the system, cable connectivity faults can be detected in DC-coupled or AC-coupled modes or both, despite the differences in signal amplitude levels of the various types of input signals. Cable connectivity faults such as stuck-at high, stuck-at low, floating signal and shorted AC-coupled capacitor can be detected in accordance with embodiments of the invention.

Figure 2:
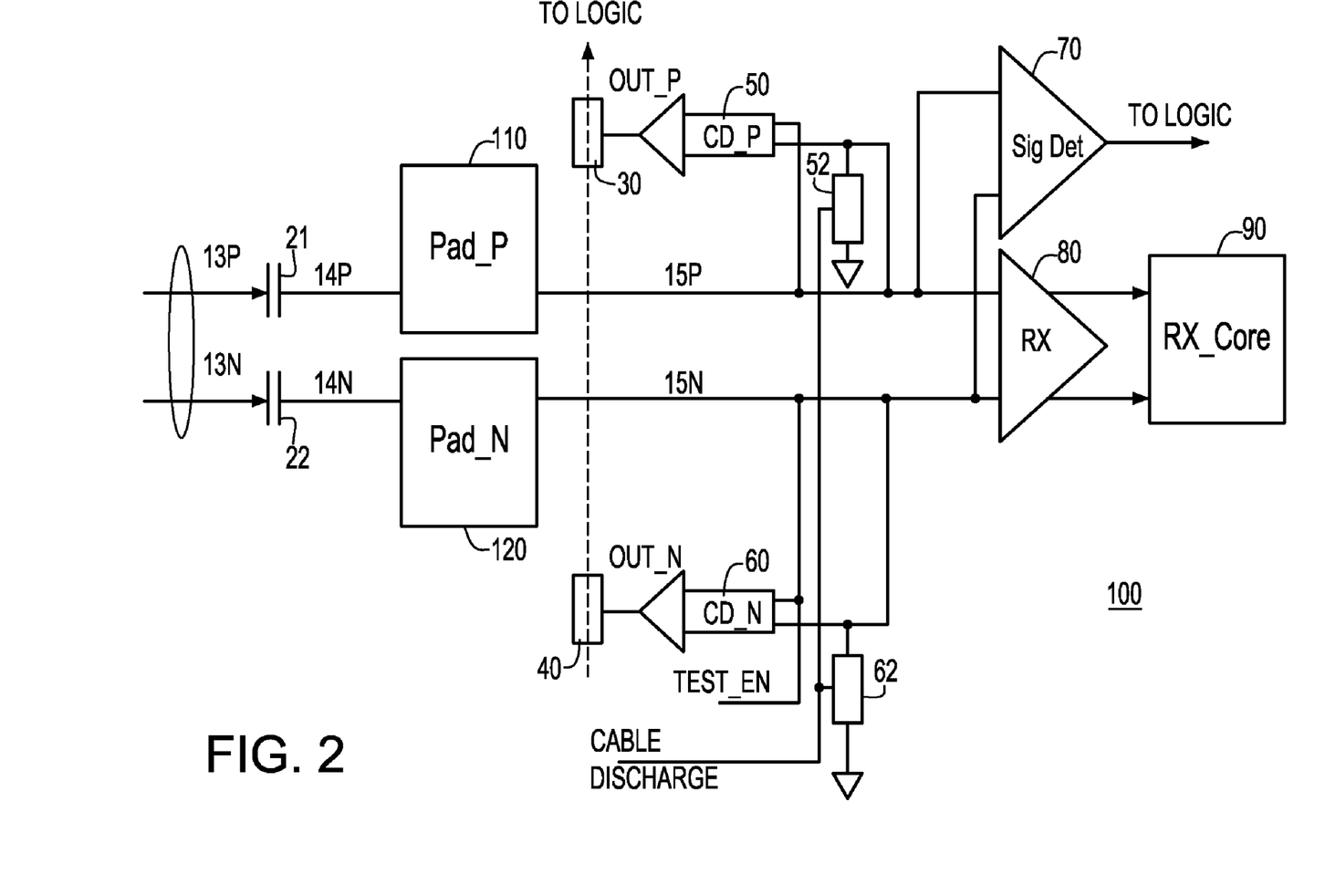
FIG. 2 is a block diagram illustrating a connection arrangement of a cable connectivity test receiver in accordance with an embodiment of the invention.

FIG. 2 is a block and schematic diagram illustrating the interconnection of a pair of cable fault detectors 50, 60 in a chip 100 according to an embodiment of the invention. As shown therein, signals arrive from a transmission link on a pair of cables 13P and 13N carrying differential signals, and are coupled by coupling capacitors 21, 22, respectively, to signal conductors 14P and 14N, which, in turn are coupled to the pads 110, 120 of the chip 100. In turn, the pads 10, 20 are coupled to a pair of internal differential signal conductors 15P and 15N, respectively. The internal differential signal conductors 15P, 15N are coupled as input to a signal detector 70 and a receiver 80. In turn, receiver 80 is connected to a receiver (RX) core 90 for outputting a latched data signal thereto.

As shown in FIG. 2, a first cable fault detector 50 is coupled to receive input from the first internal differential signal conductor 15P and a second cable fault detector 60 is coupled to receive input from the second internal differential signal conductor 15N. Each of the cable fault detectors 50, 60, when enabled by a TEST_EN input, outputs a detection signal which is latched by a respective scan latch 30, 40. Cable discharge devices 52, 62 are provided to controllably reset voltages on internal differential signal conductors 15P, 15N in accordance with a Cable Discharge signal, as appropriate before or during testing. Devices 52, 62 can also be used for ESD protection, as well, such as when connecting a cable to the chip 100. When the Cable Discharge signal is active, the voltages on the signal conductors 15P, 15N are discharged to ground. After the cable is connected to the chip 100, the Cable Discharge signal is deactivated, which then allows signals on conductors 15P and 15N to be input normally to the cable fault detector again. During testing of the cables, signal detector 70, the receiver 80, and other receiver components are turned off to reduce noise on signal conductors 15P and 15N, because single-ended cable fault detectors are more susceptible to noise.

Figure 3:
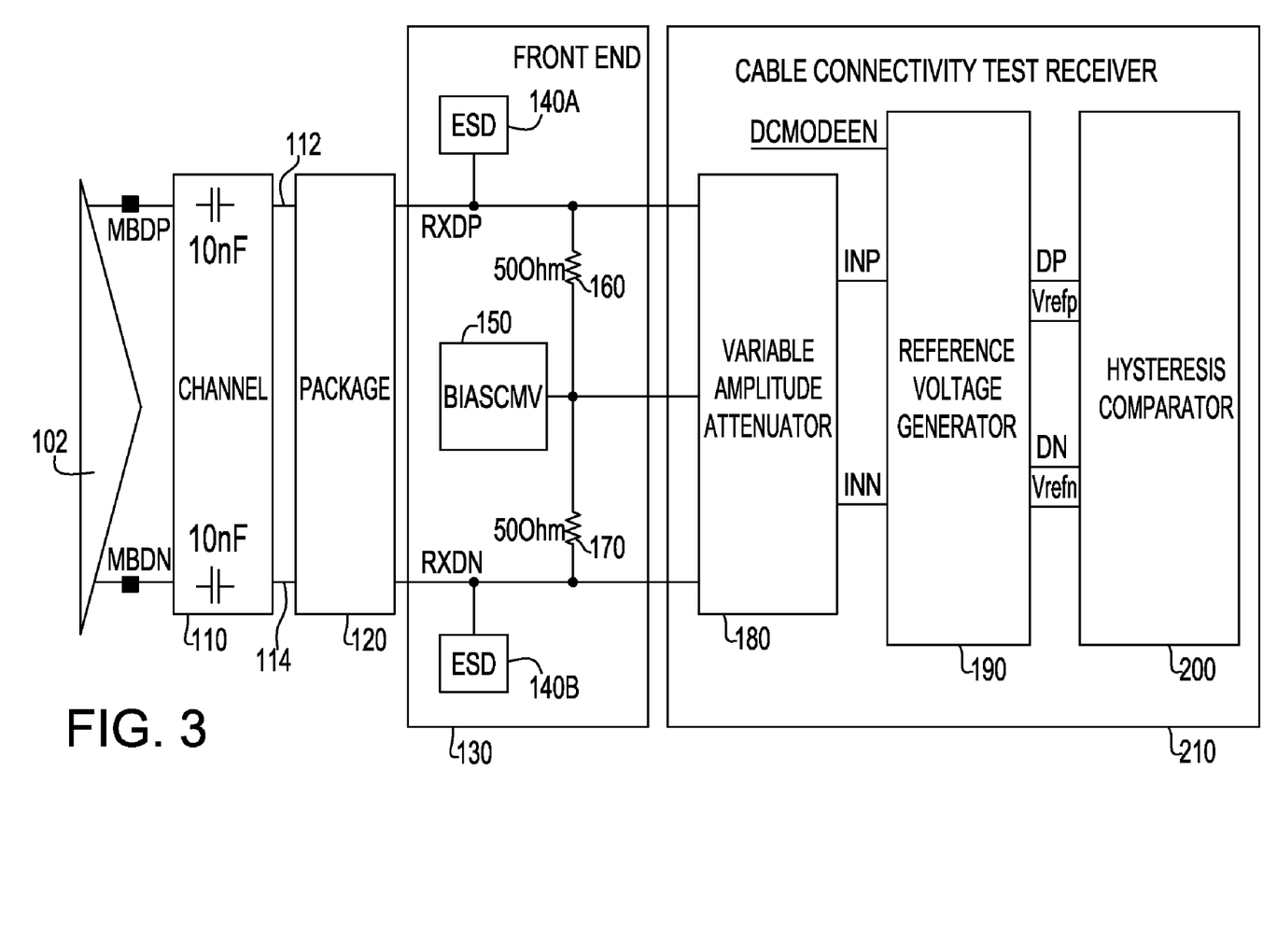
FIG. 3 is a high-level block diagram illustrating a cable connectivity test receiver in accordance with an embodiment of the invention.

FIG. 3 is a block and schematic diagram illustrating a cable connectivity test receiver in accordance with an embodiment of the invention. As illustrated therein, a pair of differential data signals MBDP and MBDN, arriving from a remote transmitter 102 through a signal transmission channel 110 on respective signal conductors 112, 114 is input to a package 120. The outputs MBDN and MBDP of the transmitter 102 can be coupled to the channel 110 in alternating current ("AC") coupled mode through decoupling capacitors (not shown). In AC coupled mode, the package generally is also coupled to the channel 110 through additional decoupling capacitors (not shown). Otherwise, the transmitter outputs MBDN and MBDP can be coupled directly to the channel 110 in direct current ("DC") coupled mode. In AC coupled mode, only AC components of transmitted signals are propagated through the channel 110. In DC coupled mode, the signals arriving from the channel 110 on conductors 112, 114 can have DC components.

After traveling through the package 120, the input signals, now called RXDP and RXDN, are input to a signal conditioning circuit referred to as a receiver "front end" circuit 130. Electrostatic discharge protection circuits ("ESD") 140A and 140B are coupled, respectively, to the conductors carrying the signals RXDP and RXDN for protecting circuits connected to the same conductors from damage due to electrostatic discharge. The front end circuit 130 also includes 50 ohm termination resistances 160, 170. Each of the termination resistances is coupled between one of the input signals RXDP and RXDN and a common mode voltage level ("VCM") node connected to a common mode voltage bias circuit ("BIASCMV") 150. Ideally, the common mode voltage level VCM remains fairly steady over many cycles of the pair of differential signals. For AC-coupled signals, VCM will be at about 200 mV below the power supply voltage level. For DC-coupled signals, VCM reflects the DC component of the signals RXDP and RXDN.

As further shown in FIG. 3, the differential pair of signals RXDP and RXDN and their common mode voltage level VCM are input to the cable connectivity test receiver 210. Desirably, the cable connectivity test receiver includes three components connected together in series. The differential pair of signals RXDP and RXDN and the common mode voltage VCM are provided as input to a variable amplitude attenuator 180. The outputs INP and INN of that attenuator 180 are input to a reference voltage generator 180. The reference voltage generator 180, in turn, generates reference voltages Vrefp and Vrefn for input to a hysteresis comparator stage 200, along with the differential signals DP and DN passed thereto from signals INP and INN.

Figure 4:
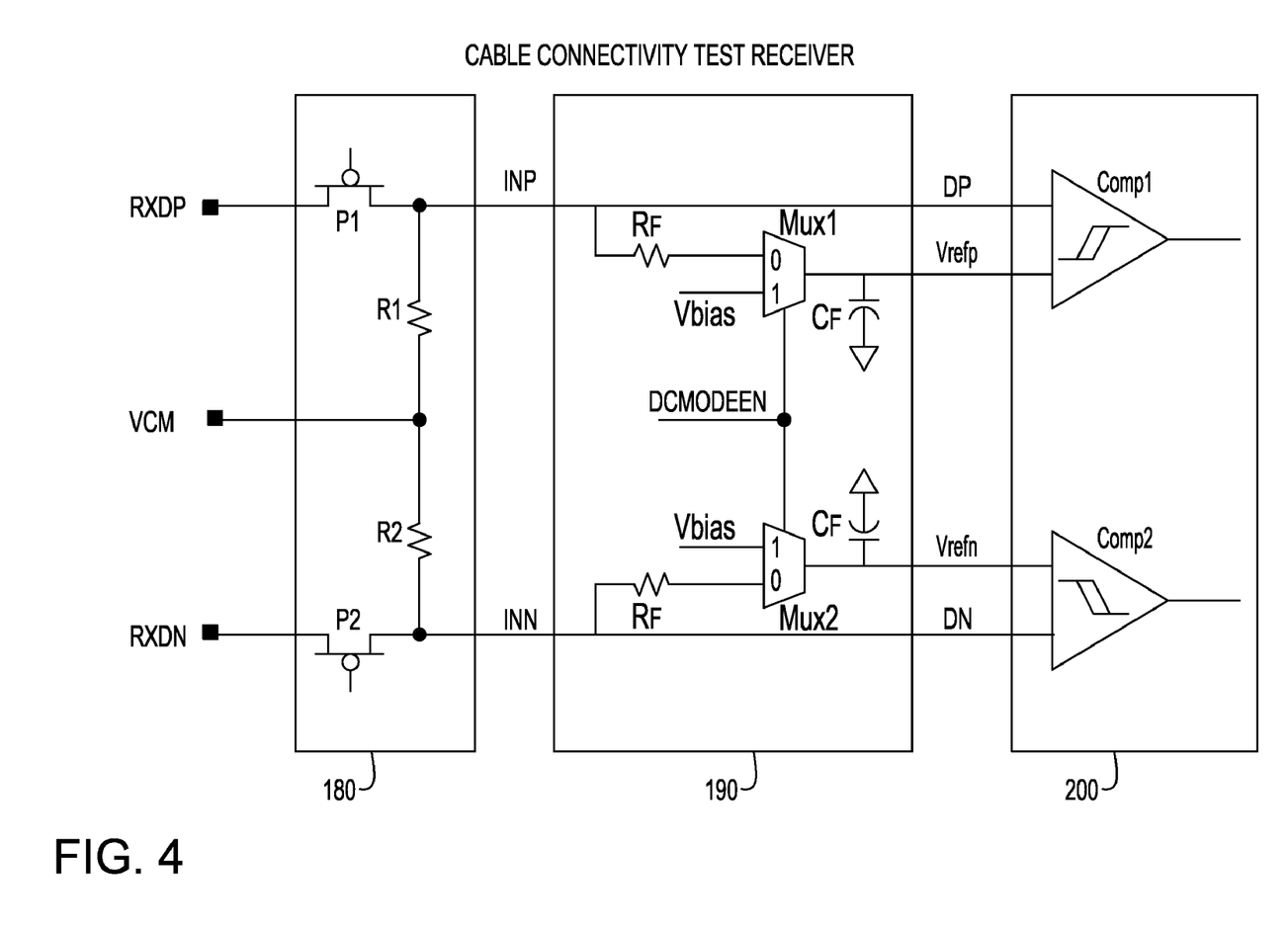
FIG. 4 is block and schematic diagram illustrating a cable connectivity test receiver in accordance with an embodiment of the invention.

FIG. 4 is a more detailed block and schematic diagram illustrating a cable connectivity test receiver according to one embodiment of the invention. As shown in FIG. 4, the purpose of the variable amplitude attenuator is to produce conditioned signals INP and INN from the respective input signals RXDP and RXDN, in which the signal swing is reduced when the signals transition between the high (voltage) level and the low level. In such way, the low voltage level of the outputs INP and INN remains sufficiently high to avoid the above-mentioned problem of drastically reduced tail current in the subsequent comparator stage. The variable amplitude attenuator 180 receives the common mode voltage VCM and applies it to the midpoint of a voltage divider formed by equal resistances R1 and R2 arranged between respective ones of the signals RXDP and RXDN.

The variable amplitude attenuator includes two PFETs P1 and P2 and two resistors R1 and R2. The two PFETs P1 and P2 can be disabled when the cable connectivity test receiver is powered down, so that all parasitic and device loading resulting from operation of the test receiver can be effectively isolated by these devices.

In operation, when the two PFETs P1 and P2 are on, P1 and P2 can be modeled as linear resistors Ron_P1 and Ron_P2, respectively. Ron_P1 and resistor R1 form a resistive divider between the signal RXDP and VCM. Similarly, Ron_P2 and resistor R2 form a resistive divider between the signal RXDN and VCM. From these two equivalent resistive dividers, it can be established that INP=R1/(Ron_P1+R1) and INP=R2/(Ron_P2+R2). In general, in AC-coupled mode, desirably, VCM is set to be slightly below the power supply voltage for high-speed data receiver performance, in terms of gain, bandwidth and linearity. During operation, when the input signals RXDP and RXDN have small amplitude, devices P1 and P2 are strongly on, their gate voltages being tied to ground, and Ron_P1 and Ron_P2 being very small. In such case, the outputs INP and INN of the variable attenuator are approximately the same as the inputs RXDP and RXDN, respectively. When the amplitudes of the input signals RXDP and RXDN increase, no effect is apparent when each input signal transitions from low to high signal level. The variable amplitude attenuation is felt most strongly for large amplitude input signals RXDP, RXDN during transitions from high to low signal levels. For example, when the input signal RXDP is transitioning from a high voltage level to a low voltage level, the device P1 initially is turned on strongly. However, as the signal RXDP continues to fall lower, nearing ground, the resistance Ron_R1 becomes very large. By operation of the resistive divider, In such way, the amplitude of the output signal INP=R1/(Ron_P1+R1) is reduced at that time in relation to the input signal RXDP. Similarly, during high to low signal transitions for the input signal RXDN, the amplitude of the output signal INN=R2/(Ron_P2+R2) is reduced at that time in relation to the input signal RXDN. Thus, the amount of attenuation is directly dependent on the amplitudes of the input signals RXDP and RXDN and the resistance values of R1 and R2.

The outputs INP and INN of the variable amplitude attenuator are applied to a reference voltage generator 190. A function of the reference voltage generator is to generate reference voltages (Vrefp and Vrefn) and pass the reference voltages with the differential pair of signals INP and INN as input signals DP and DN to the hysteresis comparator stage 200. The reference voltage generator includes two low pass filter multiplexers Mux1 and Mux2. Each of the multiplexers accepts either a self-generated reference voltage by way of a low-pass filter $R_F$ and $C_F$ or a fixed reference voltage Vbias. To reduce area required to implement the low pass filter on the chip, the on-resistance of a pass-gate inside each multiplexer can be function as the resistive element of the low-pass filter. Each low-pass filter multiplexer selects the self-generated reference voltage in AC-coupled mode and selects a fixed reference voltage Vbias in DC-coupled mode. The reference voltage generator 190 passes the input signals INP and INN directly to the hysteresis comparator stage 200, desirably, without modification.

The hysteresis comparator stage 200 includes a first hysteresis comparator (Comp1) which is used to compare one of the signals of the differential signal pair, for example the signal DP, with the corresponding reference voltage level, Vrefp. In that way, it can be determined whether connectivity is present between the transmitter 102 and the receiver 210 along the corresponding path for the signal DP. The hysteresis comparator stage also includes a second hysteresis comparator (Comp2) which compares the signal DN with the corresponding reference voltage level, Vrefn. In that way, it can be determined whether connectivity is present between the transmitter 102 and the receiver 210 along the corresponding path for the signal DN.

Figure 5:
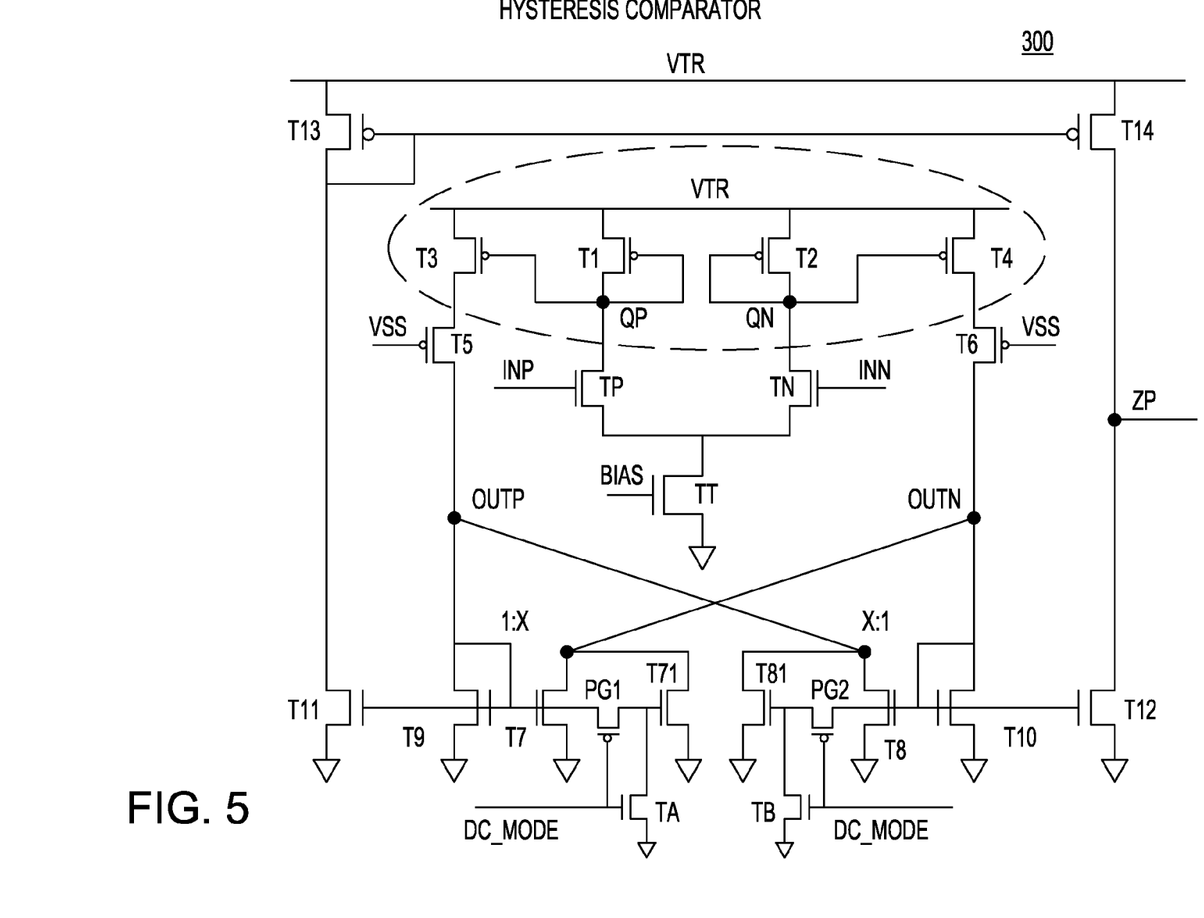
FIG. 5 is a schematic diagram illustrating a hysteresis comparator incorporated into cable connectivity test receiver in accordance with an embodiment of the invention.

FIG. 5 is a schematic diagram illustrating a transistor-level structure of a hysteresis comparator 300 according to one embodiment of the invention. One such hysteresis comparator 300 can function as comparator Comp1 and another such comparator 300 can function as comparator Comp2 of the hysteresis comparator stage 200 (FIG. 4). The output of each comparator 300 is a rail-to-rail logic signal which swings between the high state at the power supply voltage level VTR and the low state at ground.

Where one of the comparators functions as Comp1, the data signal input DP is applied to the INP input terminal, and the reference voltage Vrefp is applied to the INN input terminal. The output ZP of comparator 300 as Comp1 is latched to a high rail-to-rail state when the DP signal rises sufficiently above Vrefp and the output ZP is latched to a low rail-to-rail state when the DP signal falls sufficiently below Vrefp. Where the other one of the comparators functions as Comp2, the data signal input DN is applied to the INP input terminal, and the reference voltage Vrefn is applied to the INN input terminal. In this case, the output ZP of comparator 300 as Comp2 is latched to a high rail-to-rail state when the DN signal rises sufficiently above Vrefn and the output ZP is latched to a low rail-to-rail state when the DN signal falls sufficiently below Vrefn.

The comparator 300 includes a current source formed by tail device TT and controlled bias input BIAS, a pair of input NFET devices TP and TN to which the input signals are applied, and active current mirror loading devices T1, T2, T3 and T4. The comparator further includes protection devices T5 and T6 and latching elements T7, T8, T9 and T10. The comparator further includes push-pull comparison devices T11, T12, T13 and T14.

The comparator 300 has two operational modes: DC-coupled and AC-coupled. In this way, the degree, i.e., the amount of hysteresis applied during AC-coupled mode can be different from the degree of hysteresis applied during DC-coupled mode. Desirably, the degree of hysteresis applied during AC-coupled mode is greater than the degree of hysteresis applied during DC-coupled mode. The hysteresis comparator includes a transistor T71 and a passgate PG1 which switchably connects the gates of transistors T71 and T7 together during the AC-coupled mode. Similarly, a passgate PG2 switchably connects the gates of transistors T71 and T7 together during the AC-coupled mode. AC-coupled mode operation is enabled when the DC_Mode signal is low.

During DC-coupled mode, the DC_Mode signal goes high to switch off the passgates PG1 and PG2 and disconnect transistors T71 and T81 from transistors T7 and T8, respectively. Transistors T71 and T81 are turned off by operation of the transistors TA and TB. During DC-coupled mode, when the transistors T71 and T81 are disconnected, transistors T7 or T8 turn on more quickly such that the hysteresis comparator reaches the latched state soon. As a result, the degree of hysteresis is relatively small.

On the other hand, during AC-coupled mode, transistor T71 operates in parallel with transistor T7 and transistor T81 operates in parallel with transistor T8. In that case, during AC-coupled mode, each respective pair of transistors, i.e., the pair of transistors T7 and T71, or the pair of transistors T8 and T81 takes longer to turn on, causing the degree of hysteresis to be greater than for DC-coupled mode.

The following description of operation is described first for DC-coupled mode, after which differences relating to AC-coupled mode will be explained. Passgates PG1 and PG2 are turned off and transistors TA and TB and turned on by the DC_Mode signal during DC-coupled mode. During operation, the comparator 300 senses the input signals at transistors TP and TN. The input signals are then reflected inversely at nodes QP and QN by the action of active current mirror loading devices T1 and T2. The signal information captured at nodes QP and is then latched onto the nodes OUTP and OUTN by operation of NFET latching elements T7, T8, T9, and T10. In this way, a large amplitude input signal applied to INP or INN which exceeds the power supply voltage VTR is only sensed by the PFET sensing elements T1 and T2. The NFET latching devices T7, T8, T9 and T10, each having a drain connected to ground, are impervious to large amplitude signals which rise above the level of the power supply voltage VTR. In such way, the signal information can be reliably latched even when the input signal exceeds VTR.

The PFET current mirror devices T1, T2, T3 and T4 and additional amplification provided by the NFET latching elements T7, T8, T9 and T10, give the hysteresis comparator 300 quick response time. Quick response time is an advantage when the cable connectivity test receiver is AC-coupled to the signal transmission path due to decay of signals in AC-coupled mode. For this reason, it is also desirable to design the PFET active current mirror devices T1, T2, T3 and T4 to have a thin or intermediate thickness gate oxide or other gate dielectric material. Desirably, each of the devices T1, T2, T3 and T4 has the same design and the same thickness of gate dielectric to avoid mismatch among these current mirroring devices. During operation, one of the nodes OUTP or OUTN can drop as low as ground. In that case, the active PFET current mirror devices T3 and T4 could become overstressed. To help address this problem, PFET devices T5 and T6 can be made to incorporate a thicker gate oxide or other thick gate dielectric material. The thicker gate dielectric can increase the voltage drop Vds between the drain and the source of devices T5 and T6, which in turn, reduces the voltage drop across transistors T3 and T4.

Figure 6A:
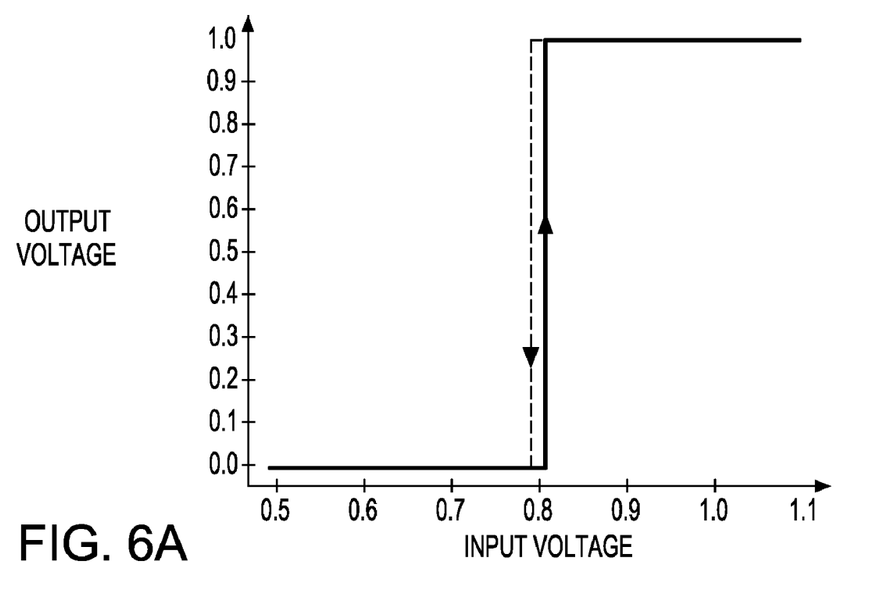
FIG. 6A is a graph illustrating operation of the hysteresis comparator shown in FIG. 5 during DC-coupled mode in accordance with an embodiment of the invention.

Referring to FIG. 6A, during DC-coupled mode testing, the degree of hysteresis is relatively small. The hysteresis threshold levels are close together: 0.79 V and 0.81 V, respectively. That is, the output of the comparator transitions to a high level when the input signal exceeds 0.81 V, but the input signal must fall below 0.79 V before the output transitions to a low level.

Figure 6B:
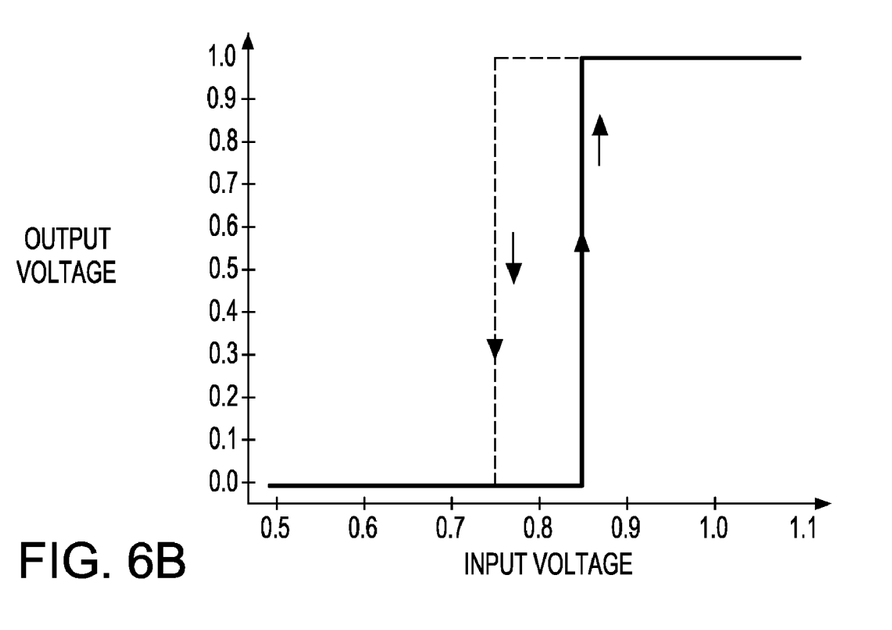
FIG. 6B is a graph illustrating operation of the hysteresis comparator shown in FIG. 5 during AC-coupled mode in accordance with an embodiment of the invention.

During AC-coupled mode, operation is the same as described above for DC-coupled mode, except that the DC_Mode signal goes low and is disabled. As a result, the passgates PG1 and PG2 are turned on, transistors TA and TB are turned off and transistors T71 and T81 operate in parallel with transistors T7 and T8, respectively, such that greater hysteresis is applied during operation. For example, as shown in FIG. 6B, during AC mode testing, the hysteresis threshold levels are 0.75 V and 0.85 V, respectively. That is, the output of the comparator transitions to a high level when the input signal exceeds 0.85 V, but the input signal falls below 0.75 V before the output transitions to a low level.

The outputs of each hysteresis comparator (Comp1 and Comp2) are conditioned, e.g., by inverters (not shown) and temporarily stored as samples, such as in shift registers, for further analysis. Detection of various fault modes can then be performed using the samples stored in the shift register. In one particular example, a shorted decoupling capacitor used in an AC-coupled transmission path can be detected from the stored samples. In AC-coupled mode, a functioning (non-shorted) decoupling capacitor causes the signal arriving at the receiver side to decay rather quickly. A shorted decoupling capacitor can be detected when stored samples at least one RC time constant after the transition of the transmitted signal still show the presence of the signal.

Stuck-at faults, i.e., a problem in the cable which makes the signal appear to remain constant, i.e., "stuck" at a certain level, can also be detected by the failure of the stored samples to show transitions in the incoming signal. A third kind of fault, referred to as "floating," occurs when the signal appears not to have a determinate value. Such fault can be detected by the failure of the stored samples to reflect the pattern of the transmitted test data.

Various combinations and modifications can be made to the above-described embodiments of the invention. For example, in one embodiment, a cable connectivity test receiver can be provided which includes the above-described variable amplitude attenuator, but which includes elements different from the above-described reference voltage generator 190 and hysteresis comparator stage 300. Alternatively, another embodiment of the invention can include the hysteresis comparator without the variable amplitude attenuator 190.

While the invention has been described in accordance with certain preferred embodiments thereof, many modifications and enhancements can be made thereto without departing from the true scope and spirit of the invention, which is limited only by the claims appended below.

What is claimed is:

1. A system for detecting a fault in a signal transmission path, comprising:
   a variable amplitude signal attenuator to modify an input signal by variably attenuating a signal voltage swing of the input signal only when transitioning from a high signal voltage level towards a low signal voltage level such that a larger high-to-low signal voltage swing is attenuated more than a smaller high-to-low signal voltage swing; and a comparator to detect a crossing of a reference voltage level by the modified input signal such that when the comparator does not detect an expected crossing of the reference voltage level by the modified input signal, the fault is determined to be detected in the signal transmission path.

2. A system as claimed in claim 1, wherein the input signal is one signal among a differential signal pair including the input signal and an inverse version of the input signal and the variable amplitude signal attenuator includes first and second p-type field effect transistors ("PFETs"), the first PFET having a source-drain conduction path coupled to the input signal, the second PFET having a source-drain conduction path coupled to the inverse version input signal, and each of the first and second PFETs having gates tied to the same potential.

3. A system as claimed in claim 2, wherein each of the first and second PFETs has a drain coupled to a detected common mode voltage level of the differential signal pair through a load having a predetermined resistance.

4. A system as claimed in claim 1, wherein the comparator is to latch a state of the input signal even when a level of the input signal is above a power supply voltage level supplied to the comparator.

5. A system as claimed in claim 4, wherein said comparator includes a hysteresis comparator, said hysteresis comparator including a latch having n-type field effect transistor ("NFET") storage elements.

6. A system as claimed in claim 1, wherein said reference level generator is to selectably switch between outputting a first reference voltage level as a DC-coupled mode threshold and a second reference voltage level as an AC-coupled mode threshold.

7. A system as claimed in claim 6, wherein the DC-coupled mode threshold is a fixed potential and the AC-coupled mode threshold varies with time.

8. A system as claimed in claim 7, further comprising a reference level generator to output the AC-coupled mode threshold, wherein said comparator is to detect a falling crossing of the AC-coupled mode threshold at a lower voltage level than to detect a rising crossing of the AC-coupled mode threshold.

9. A system as claimed in claim 8, wherein said reference level generator is to maintain the DC-coupled mode threshold at a substantially constant level, wherein said comparator is operable to apply greater hysteresis to the detection of transitions in the input signal during AC-coupled mode than during DC-coupled mode.

10. A system as claimed in claim 8, wherein the reference level generator is to apply low-pass filtering to the input signal to self-generate the AC-coupled mode threshold.

11. A method of detecting a fault in a signal transmission path, comprising the steps of:

(a) modifying an input signal by variably attenuating a signal voltage swing of the input signal only when transitioning from a high signal voltage level towards a low signal voltage level such that a larger high-to-low signal voltage swing is attenuated more than a smaller high-to-low signal voltage swing; and (b) detecting a fault in the signal transmission path by detecting whether the modified input signal crosses a reference voltage level as expected.

12. A method as claimed in claim 11, wherein the input signal is one signal among a differential signal pair including the input signal and an inverse version of the input signal and step (a) includes variably attenuating each of the input signal and the inverse version of the input signal during high-to-low transitions when the signal voltage swing is sufficiently large.

13. A method as claimed in claim 12, wherein each of the first and second PFETs has a drain coupled to a detected common mode voltage level of the differential signal pair through a load having a predetermined resistance.

14. A method as claimed in claim 13, further comprising latching a state of the modified input signal even when a level of the modified input signal is higher than a power supply voltage level supplied to a comparator used to perform step (b).

15. A method as claimed in claim 14, wherein said latching is performed by a latch having n-type field effect transistor ("NFET") storage elements.

16. A method as claimed in claim 11, wherein said step (b) includes detecting whether said modified input signal crosses a first reference voltage level as a DC-coupled mode threshold during DC-coupled mode and crosses a second reference voltage level different from said first reference voltage level as an AC-coupled mode threshold during AC-coupled mode.

17. A method as claimed in claim 16, wherein the DC-coupled mode threshold is a fixed potential and the AC-coupled mode threshold varies with time.

18. A method as claimed in claim 17, further comprising generating the AC-coupled mode threshold, such that said step (b) includes detecting a falling crossing of the AC-coupled mode threshold at a lower voltage level than detecting a rising crossing of the AC-coupled mode threshold.

19. A method as claimed in claim 18, further comprising applying low-pass filtering to the modified input signal to self-generate the AC-coupled mode threshold.

20. A method as claimed in claim 19, further comprising maintaining the DC-coupled mode threshold at a substantially constant level, and applying greater hysteresis to the detection of transitions in the input signal during AC-coupled mode than during DC-coupled mode.

* * * * *